US010328547B2

(12) United States Patent
Sekiya

(10) Patent No.: US 10,328,547 B2
(45) Date of Patent: Jun. 25, 2019

(54) GRINDING APPARATUS AND WAFER PROCESSING METHOD

(71) Applicant: DISCO CORPORATION, Tokyo (JP)

(72) Inventor: Kazuma Sekiya, Tokyo (JP)

(73) Assignee: Disco Corporation, Tokyo (JP)

( * ) Notice: Subject to any disclaimer, the term of this patent is extended or adjusted under 35 U.S.C. 154(b) by 77 days.

(21) Appl. No.: 15/729,922

(22) Filed: Oct. 11, 2017

(65) Prior Publication Data

US 2018/0099373 A1    Apr. 12, 2018

(30) Foreign Application Priority Data

Oct. 12, 2016 (JP) .................................. 2016-201092

(51) Int. Cl.

| | | |
|---|---|---|
| *B24B 37/00* | (2012.01) | |
| *B24B 37/005* | (2012.01) | |
| *B24B 37/20* | (2012.01) | |
| *B24B 37/30* | (2012.01) | |
| *H01L 21/687* | (2006.01) | |
| *H01L 21/66* | (2006.01) | |
| *H01L 21/677* | (2006.01) | |
| *H01L 21/67* | (2006.01) | |
| *H01L 21/304* | (2006.01) | |

(52) U.S. Cl.
CPC ............ *B24B 37/005* (2013.01); *B24B 37/20* (2013.01); *B24B 37/30* (2013.01); *H01L 21/304* (2013.01); *H01L 21/67092* (2013.01); *H01L 21/67132* (2013.01); *H01L 21/67219* (2013.01); *H01L 21/67253* (2013.01); *H01L 21/67778* (2013.01); *H01L 21/68757* (2013.01); *H01L 22/20* (2013.01); *H01L 22/12* (2013.01)

(58) Field of Classification Search
CPC ....... B24B 37/20; B24B 37/30; B24B 37/005; H01L 21/67092; H01L 21/67132; H01L 21/67219; H01L 21/67253; H01L 21/67778; H01L 21/68757; H01L 22/20; H01L 22/22
USPC .......... 451/5, 6, 41, 285–290, 57, 58, 66, 69
See application file for complete search history.

(56) References Cited

U.S. PATENT DOCUMENTS 6,245,677 B1 *  6/2001  Haq .................... B24B 37/042
                                                    257/E21.219
9,379,015 B2 *  6/2016  Matsuzaki ............. H01L 21/78
(Continued)

FOREIGN PATENT DOCUMENTS

JP           05-335411          12/1993

*Primary Examiner* — George B Nguyen
(74) *Attorney, Agent, or Firm* — Greer Burns & Crain, Ltd.

(57) ABSTRACT

A grinding apparatus includes a chuck table for holding a wafer having a modified layer near the front side or a groove on the front side, the groove having a depth not less than a finished thickness of the wafer, a grinding unit for grinding the back side of the wafer to divide the wafer into a plurality of chips, a die strength measuring unit for measuring the die strength of any one of the chips, and a control unit for controlling each component according to a measured value of die strength. The control unit determines that grinding is not to be performed on the remaining wafers stored in the cassette when the measured value is less than a threshold value, and determines that grinding is to be performed on the remaining wafers when the measured value is greater than or equal to the threshold value.

3 Claims, 9 Drawing Sheets

(56) References Cited

U.S. PATENT DOCUMENTS

| | | | | |
|---|---|---|---|---|
| 2004/0092108 A1* | 5/2004 | Yajima | ............... | B24B 37/30 |
| | | | | 438/689 |
| 2009/0098808 A1* | 4/2009 | Kajiyama | ............. | B24B 1/00 |
| | | | | 451/41 |
| 2009/0247056 A1* | 10/2009 | Masuda | ............ | B24B 7/228 |
| | | | | 451/54 |
| 2010/0047999 A1* | 2/2010 | Hoshino | ......... | H01L 21/67092 |
| | | | | 438/463 |
| 2012/0100696 A1* | 4/2012 | Nakamura | ......... | H01L 21/78 |
| | | | | 438/463 |
| 2012/0289027 A1* | 11/2012 | Harada | ............ | H01L 21/78 |
| | | | | 438/463 |
| 2015/0311088 A1* | 10/2015 | Krishnan | ........... | B24B 37/04 |
| | | | | 438/692 |

* cited by examiner

GRINDING APPARATUS AND WAFER PROCESSING METHOD

BACKGROUND OF THE INVENTION

Field of the Invention

The present invention relates to a grinding apparatus for grinding a wafer and also to a wafer processing method using this grinding apparatus.

Description of the Related Art

In electronic equipment typified by mobile phones and personal computers, a device chip having a device such as integrated circuit (IC) is an essential component. The device chip is obtained by preparing a wafer formed of a semiconductor such as silicon, next partitioning the front side of the wafer along a plurality of division lines (streets) to define a plurality of separate regions, next forming a device in each separate region, and finally dividing the wafer along these division lines.

There has recently increased an occasion to reduce the thickness of the wafer by any method such as grinding for the purpose of reducing the size and weight of the device chip. For example, by using dicing before grinding (DBG) including the steps of forming a groove on the front side of the wafer, the groove having a depth greater than or equal to a finished thickness of each device chip, and next grinding the back side of the wafer until the bottom of the groove is exposed to the back side of the wafer, the wafer can be thinned and simultaneously divided into a plurality of device chips (see Japanese Patent Laid-open No. 1993-335411, for example). This dicing before grinding method has another merit such that the occurrence of chipping on the back side of the wafer can be reduced to thereby improve the die strength of each device chip. The die strength is one of the important points in evaluating each device chip, and it is always measured after changing the kind of the wafer or processing conditions.

SUMMARY OF THE INVENTION

However, the die strength is measured by a measuring apparatus separate from a grinding apparatus after grinding all of the wafers stored in a cassette transferred to the grinding apparatus. Accordingly, in the case that the processing conditions are erroneously set, there is a possibility that a large number of device chips having low die strength may be manufactured. Further, the device chips (wafer) are transferred from the grinding apparatus to the measuring apparatus in measuring the die strength of each device chip, there is another problem such that a considerable amount of time is required for the measurement of the die strength.

It is therefore an object of the present invention to provide a grinding apparatus which can efficiently measure the die strength of each device chip.

It is another object of the present invention to provide a wafer processing method using this grinding apparatus.

In accordance with an aspect of the present invention, there is provided a grinding apparatus including a chuck table for holding the front side of a wafer having a modified layer near the front side or a groove on the front side, the groove having a depth not less than a finished thickness of the wafer; a grinding unit for grinding the back side of the wafer held on the chuck table to thereby divide the wafer into a plurality of chips along the modified layer or the groove; a cassette mounting area for mounting a cassette storing a plurality of wafers including the wafer; a loading unit for loading the wafer from the cassette mounted on the cassette mounting area to the chuck table; a die strength measuring unit for measuring the die strength of any one of the chips obtained by dividing the wafer in the grinding unit; and a control unit for controlling each component according to a measured value for the die strength measured by the die strength measuring unit; the control unit having a determining section for determining that grinding is not to be performed to the remaining wafers stored in the cassette when the measured value is less than a threshold value, whereas determining that grinding is to be performed to the remaining wafers stored in the cassette when the measured value is greater than or equal to the threshold value.

Preferably, a protective member is attached to the front side of the wafer, and the front side of the wafer is held through the protective member on the chuck table, and the grinding apparatus further includes a chip transfer unit for peeling the chip from the protective member and transferring the chip to the die strength measuring unit.

In accordance with another aspect of the present invention, there is provided a wafer processing method using the above grinding apparatus, the wafer processing method including a front processing step of forming the modified layer near the front side of the wafer or the groove on the front side of the wafer; a protective member attaching step of attaching a protective member to the front side of the wafer after performing the front processing step; a grinding step of grinding by the grinding unit the back side of the wafer held through the protective member on the chuck table after performing the protective member attaching step, thereby dividing the wafer into the chips along the modified layer or the groove; and a determining step of measuring the die strength of any one of the chips obtained by dividing the wafer after performing the grinding step, and then determining that grinding is not to be performed to the remaining wafers stored in the cassette when the measured value is less than the threshold value, whereas determining that grinding is to be performed to the remaining wafers stored in the cassette when the measured value is greater than or equal to the threshold value.

As described above, the grinding apparatus according to the present invention includes the die strength measuring unit for measuring the die strength of any one of the chips obtained by dividing the wafer and the control unit for controlling each component according to a measured value for the die strength measured by the die strength measuring unit, in which the control unit has the determining section for determining that grinding is not to be performed to the remaining wafers stored in the cassette when the measured value is less than a threshold value, whereas determining that grinding is to be performed to the remaining wafers stored in the cassette when the measured value is greater than or equal to the threshold value. Further, the wafer processing method using this grinding apparatus includes the determining step of measuring the die strength of the chip and determining that grinding is not to be performed to the remaining wafers when the measured value for the die strength is less than the threshold value, whereas determining that grinding is to be performed to the remaining wafers when the measured value is greater than or equal to the threshold value. Accordingly, by measuring the die strength of any one of the chips obtained by dividing one of the wafers stored in the cassette, i.e., rather than by grinding all of the wafers stored in the cassette, it is possible to determine whether or not grinding is to be performed to the remaining wafers, according to the result of measurement of the die strength. Accordingly, it is possible to reduce the possibility that a large number of chips having low die strength may be manufactured. Furthermore, since the die strength of the chip is measured in the grinding apparatus, time required for the measurement of the die strength can also be reduced. Thus, the die strength of the chip can be efficiently measured according to the grinding apparatus of the present invention and according to the wafer processing method of the present invention.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
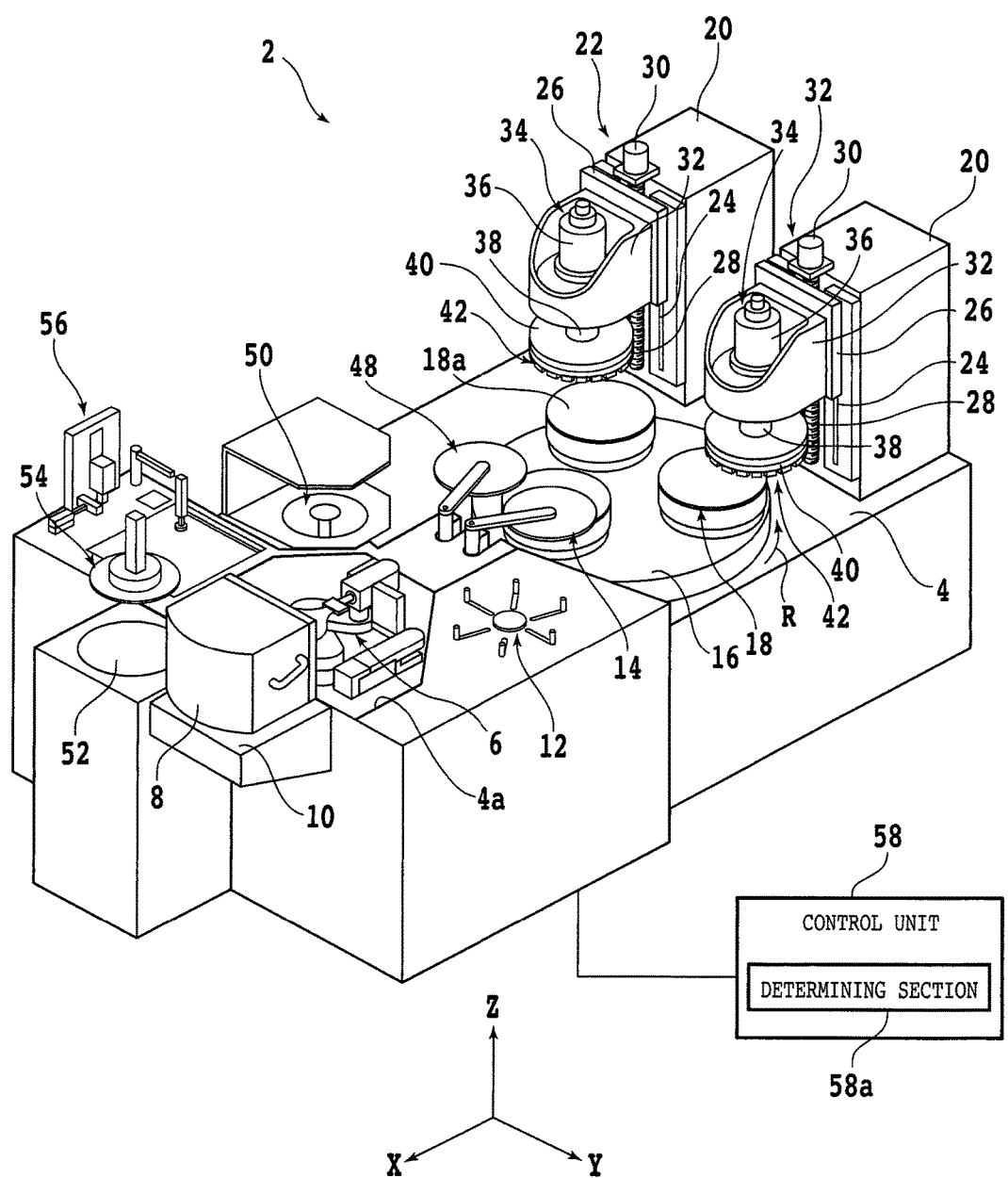
FIG. 1 is a schematic perspective view depicting the configuration of a grinding apparatus according to a preferred embodiment of the present invention.

A preferred embodiment of the present invention will now be described with reference to the attached drawings. FIG. 1 is a schematic perspective view depicting the configuration of a grinding apparatus 2 according to this preferred embodiment. As depicted in FIG. 1, the grinding apparatus 2 has a base 4 for supporting various structures. An opening 4a is formed at a front end portion of the upper surface of the base 4. A transfer mechanism 6 for transferring a wafer 11 (see FIG. 4A) as a workpiece to be ground is provided in the opening 4a. A cassette table (cassette mounting area) 10 for mounting a cassette 8 is provided on the front side of the opening 4a, in which a plurality of wafers 11 are stored in the cassette 8. A position adjusting mechanism 12 for adjusting the position of the wafer 11 transferred by the transfer mechanism 6 is provided on the obliquely rear side of the opening 4a. For example, the position adjusting mechanism 12 is so designed as to center the wafer 11 transferred from the cassette 8 by the transfer mechanism 6. A loading mechanism (loading unit) 14 for loading the wafer 11 is provided adjacent to the position adjusting mechanism 12, in which the loading mechanism 14 is so designed as to hold the wafer 11 under suction and rotate about a vertical axis. The loading mechanism 14 has a suction pad for holding the whole upper surface of the wafer 11 under suction. The wafer 11 held by the suction pad is transferred from the position adjusting mechanism 12 to the rear side thereof.

A turn table 16 is provided on the rear side of the loading mechanism 14. The turn table 16 is connected to a rotational drive source (not depicted) such as a motor and adapted to rotate about a vertical axis substantially parallel to the Z direction (vertical direction) depicted by an arrow Z. Three chuck tables 18 each for holding the wafer 11 under suction are provided on the upper surface of the turn table 16 so as to be arranged at substantially equal angular intervals. The number of the chuck tables 18 is not limited. A standby position is defined adjacent to the loading mechanism 14, and the wafer 11 held by the suction pad of the loading mechanism 14 is loaded to the chuck table 18 set at the standby position. For example, the turn table 16 is adapted to rotate in the direction depicted by an arrow R in FIG. 1, thereby sequentially moving each chuck table 18 from the standby position through a coarse grinding position to a finish grinding position and finally returning it to the standby position. Each chuck table 18 is connected to a rotational drive source (not depicted) such as a motor and adapted to rotate about a vertical axis substantially parallel to the Z direction. A part of the upper surface of each chuck table 18 is formed as a holding surface 18a for holding the wafer 11 under suction. The holding surface 18a is connected through a passage (not depicted) to a vacuum source (not depicted), in which the passage is formed inside the chuck table 18. Accordingly, a vacuum produced by the vacuum source acts on the holding surface 18a to thereby hold the lower surface of the wafer 11 loaded on the chuck table 18 at the standby position.

Two columnar support structures 20 are each provided on the back side of the coarse grinding position and on the back side of the finish grinding position (i.e., on the back side of the turn table 16). A Z moving mechanism 22 is provided on the front surface of each support structure 20. Each Z moving mechanism 22 includes a pair of Z guide rails 24 extending substantially parallel to the Z direction. A Z movable plate 26 is slidably mounted on the Z guide rails 24 of each Z moving mechanism 22. The rear surface (back side) of each Z movable plate 26 is provided with a nut portion (not depicted), and a Z ball screw 28 extending parallel to the Z guide rails 24 is threadedly engaged with the nut portion of each Z movable plate 26. A Z pulse motor 30 is connected to one end of each Z ball screw 28. Accordingly, when each Z pulse motor 30 is operated to rotate the corresponding Z ball screw 28, the corresponding Z movable plate 26 is moved along the corresponding Z guide rails 24 in the Z direction.

A holder 32 is provided on the front surface (front side) of each Z movable plate 26. A grinding unit 34 for grinding the wafer 11 is supported to each holder 32. Each grinding unit 34 has a spindle housing 36 fixed to the corresponding holder 32. A spindle 38 is rotatably housed in each spindle housing 36 so as to be rotatable about a vertical axis substantially parallel to the Z direction. A lower end portion of each spindle 38 is exposed from the lower end surface of the corresponding spindle housing 36. A disk-shaped mount 40 is fixed to the lower end of each spindle 38. A circular grinding wheel 42 is mounted on the lower surface of each mount 40, in which the diameter of the grinding wheel 42 is substantially equal to that of the mount 40. Each grinding wheel 42 is composed of a wheel base 44 (see FIG. 5B) and a plurality of abrasive members 46 (see FIG. 5B) fixed to the lower surface of the wheel base 44 so as to be arranged annularly. Each wheel base 44 is formed of metal such as stainless steel and aluminum.

The wafer 11 loaded to the chuck table 18 by the loading mechanism 14 is ground by each grinding unit 34. More specifically, the turn table 16 is rotated to move the chuck table 18 holding the wafer 11 to the coarse grinding position or the finish grinding position. Thereafter, the grinding unit 34 is lowered in the condition where both the chuck table 18 and the grinding wheel 42 are rotated, thereby bringing the abrasive members 46 of the grinding wheel 42 into contact with the upper surface of the wafer 11. As a result, the upper surface of the wafer 11 can be ground by the abrasive members 46.

An unloading mechanism 48 for unloading the wafer 11 after grinding is provided adjacent to the loading mechanism 14 and the standby position, in which the unloading mechanism 48 is so designed as to hold the wafer 11 under suction and rotate about a vertical axis. The unloading mechanism 48 has a suction pad for holding the whole upper surface of the wafer 11 under suction. The wafer 11 held by the suction pad of the unloading mechanism 48 after grinding is transferred from the chuck table 18 at the standby position to the front side thereof. A cleaning mechanism 50 for cleaning the wafer 11 transferred by the unloading mechanism 48 after grinding is provided adjacent to the unloading mechanism 48. The wafer 11 cleaned by the cleaning mechanism 50 is transferred to a temporary setting table 52 by the transfer mechanism 6, in which the temporary setting table 52 is provided on the front side of the opening 4a. The wafer 11 set on the temporary setting table 52 is next transferred to another apparatus (e.g., a protective member changing apparatus) by a transfer mechanism 54 different from the transfer mechanism 6. A die strength measuring unit 56 for measuring the die strength of a chip (device chip) 27 (see FIG. 3) obtained by dividing the wafer 11 is provided between the cleaning mechanism 50 and the temporary setting table 52. A control unit 58 is connected to each component described above. The control unit 58 functions to control the operation of each component so that the wafer 11 can be properly ground.

Figure 2:
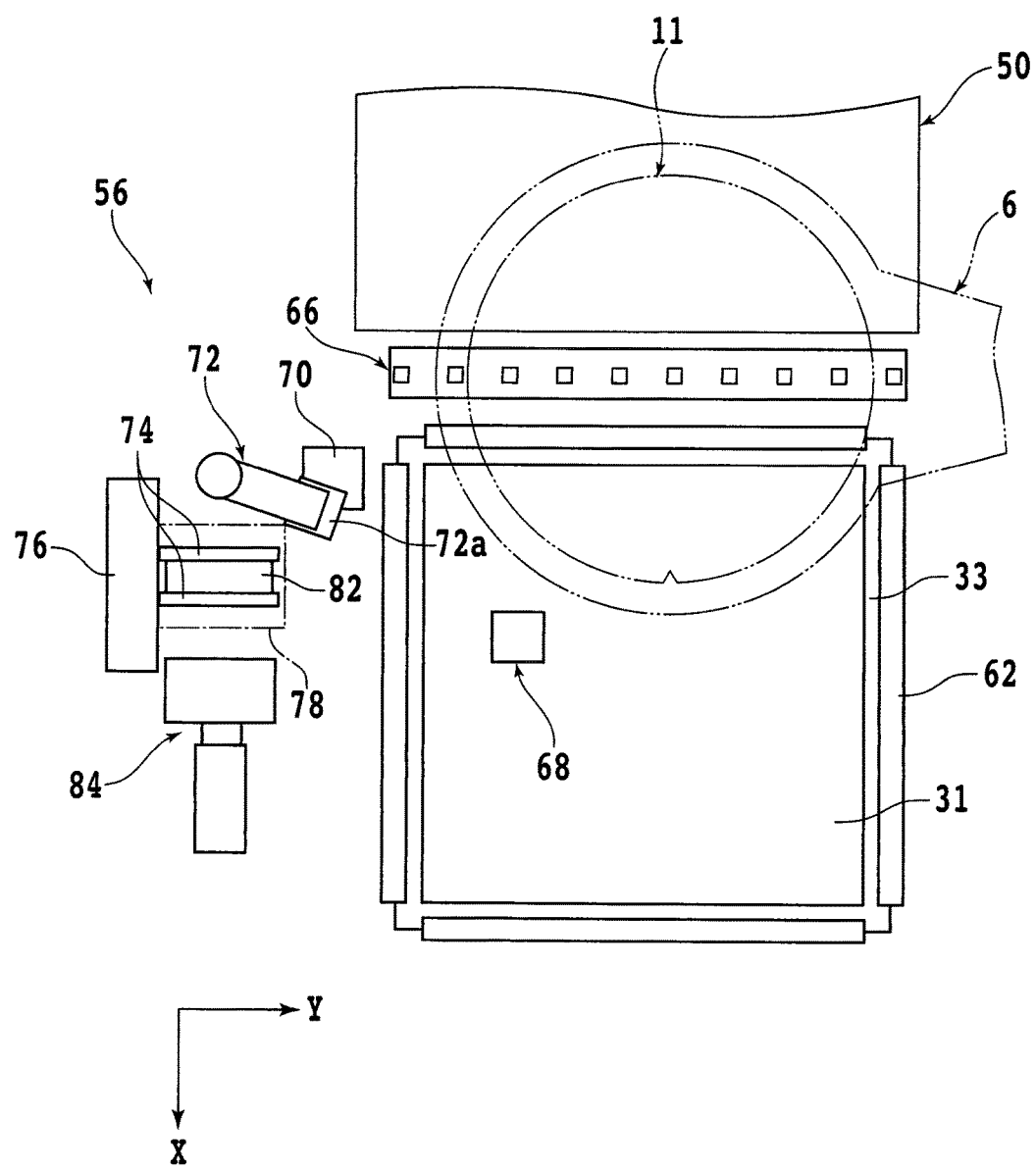
FIG. 2 is a schematic plan view depicting the configuration of a die strength measuring unit included in the grinding apparatus depicted in FIG. 1.
Figure 3:
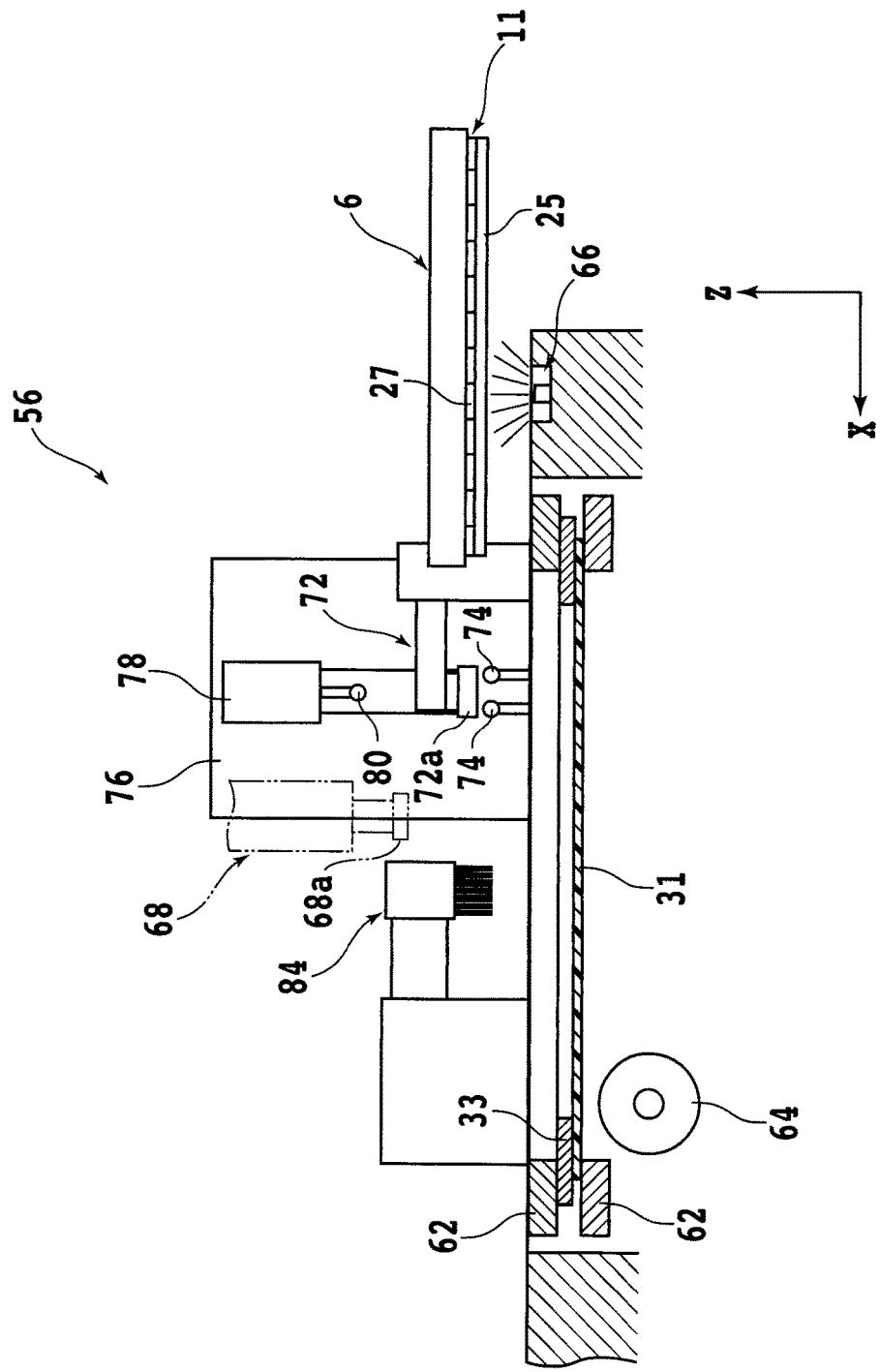
FIG. 3 is a partially sectional side view schematically depicting the configuration of the die strength measuring unit depicted in FIG. 2.

FIG. 2 is a schematic plan view depicting the configuration of the die strength measuring unit 56, and FIG. 3 is a schematic side view, partly in section, of the die strength measuring unit 56. In FIGS. 2 and 3, a part of the components is not depicted for convenience of illustration. As depicted in FIGS. 2 and 3, the die strength measuring unit 56 includes a frame clamp 62 for clamping a frame 33 fixed to the periphery of an adhesive tape 31. The adhesive tape 31 has a rectangular shape having a size capable of attaching the whole of the wafer 11. The adhesive tape 31 is composed of a base sheet and an adhesive layer formed on the upper surface of the base sheet, in which the adhesive layer has a strong adhesive force and it is exposed upward. The frame 33 is also a rectangular member having a rectangular opening for allowing the exposure of the adhesive tape 31. The lower surface of the rectangular frame 33 is fixed to the upper adhesive surface of the adhesive tape 31 so as to close the rectangular opening of the frame 33. Accordingly, the wafer 11 can be supported by the frame clamp 62 in such a manner that the frame 33 is clamped by the frame clamp 62 and the wafer 11 is attached to the adhesive tape 31 in the rectangular opening of the frame 33. A roller 64 is provided below the frame clamp 62, so as to upwardly apply a pressure to the lower surface of the adhesive tape 31 in attaching the wafer 11 to the upper surface of the adhesive tape 31. The roller 64 is supported by a moving mechanism (not depicted) in such a manner that the roller 64 is movable in the X direction (first horizontal direction) and in the Z direction by the moving mechanism. The direction of movement of the roller 64 is not especially limited.

As depicted in FIG. 2, an ultraviolet light applying unit 66 is provided between the frame clamp 62 and the cleaning mechanism 50 as viewed in plan. In the case that a protective member 25 having an adhesive layer curable by ultraviolet light is attached to the wafer 11 as depicted in FIG. 3, ultraviolet light is applied from the ultraviolet light applying unit 66 to the protective member 25, thereby curing the adhesive layer to thereby reduce the adhesive force of the protective member 25 to the wafer 11. A first chip transfer unit 68 is provided above the frame clamp 62, so as to transfer the chip 27 obtained by dividing the wafer 11. The first chip transfer unit 68 is supported by a moving mechanism (not depicted) in such a manner that the transfer unit 68 is movable in the X direction, the Y direction (second horizontal direction), and the Z direction.

As depicted in FIG. 3, the first chip transfer unit 68 has a chip suction pad 68a for holding the chip 27 under suction. The chip suction pad 68a is connected through a passage (not depicted) to a vacuum source (not depicted), in which the passage is formed inside the first chip transfer unit 68. Accordingly, a vacuum produced by this vacuum source acts on the chip suction pad 68a, so that when the chip suction pad 68a is brought into contact with the upper surface of the chip 27 (wafer 11) supported by the frame clamp 62, the chip 27 can be held by the chip suction pad 68a under suction and then transferred. As depicted in FIG. 2, a temporary setting area 70 is formed adjacent to the frame clamp 62, so as to temporarily set the chip 27 transferred by the first chip transfer unit 68. A second chip transfer unit 72 is provided adjacent to the temporary setting area 70, so as to transfer the chip 27 from the temporary setting area 70. The second chip transfer unit 72 is supported by a moving mechanism (not depicted) and a rotating mechanism (not depicted) in such a manner that the transfer unit 72 is movable in the Z direction by the moving mechanism and also rotatable about a vertical axis parallel to the Z direction by the rotating mechanism. The second chip transfer unit 72 has a chip suction pad 72a for holding the chip 27 under suction. The chip suction pad 72a is connected through a passage (not depicted) to a vacuum source (not depicted), in which the passage is formed inside the second chip transfer unit 72. Accordingly, a vacuum produced by this vacuum source acts on the chip suction pad 72a, so that when the chip suction pad 72a is brought into contact with the upper surface of the chip 27 set in the temporary setting area 70, the chip 27 can be held by the chip suction pad 72a under suction and then transferred.

A pair of support members 74 is provided adjacent to the second chip transfer unit 72 so as to be spaced a given distance from each other, in which the chip 27 transferred by the second chip transfer unit 72 is adapted to be mounted on the pair of support members 74. The pair of support members 74 extends in the Y direction and is spaced the given distance in the X direction. However, the shape, direction of extension, etc. of the support members 74 are not especially limited. A columnar support structure 76 is provided adjacent to the pair of support members 74. A Z movable block 78 is slidably mounted on one side surface of the support structure 76 so as to be located above the support members 74. The Z movable block 78 is partially overlapped with the pair of support members 74 as viewed in plan. The Z movable block 78 is movable in the Z direction by a Z moving mechanism (not depicted) provided in the support structure 76.

As depicted in FIG. 3, a pressure member 80 is provided on the lower surface of the Z movable block 78, so as to apply a pressure to the chip 27 mounted on the pair of support members 74. The pressure member 80 extends in the Y direction and is located between the pair of support members 74 as viewed in plan. However, the shape, direction of extension, etc. of the pressure member 80 may be adjusted according to the shape, direction of extension, etc. of the support members 74. A discarding hole 82 is formed below the pair of support members 74, so as to discard the chip 27 broken by the pressure member 80 in measuring the die strength of the chip 27. Further, a cleaning unit 84 is provided adjacent to the pair of support members 74, so as to clean the support members 74 after measuring the die strength of the chip 27 mounted on the support members 74.

The result of measurement of the die strength measured by the die strength measuring unit 56, i.e., a measured value for the die strength is transmitted to the control unit 58. The control unit 58 has a determining section 58a for comparing the measured value for the die strength with a required value (threshold value) for the die strength and determining whether or not grinding is to be performed to the remaining wafers 11 stored in the cassette 8. For example, in the case that the measured value is less than (or less than or equal to) the threshold value for the die strength, the determining section 58a determines that grinding is not to be performed to the remaining wafers 11 stored in the cassette 8. In the case that the measured value is greater than or equal to (or greater than) the threshold value for the die strength, the determining section 58a determines that grinding is to be performed to the remaining wafers 11 stored in the cassette 8. The control unit 58 controls the operation of each component according to the result of determination by the determining section 58a.

Figure 4A:
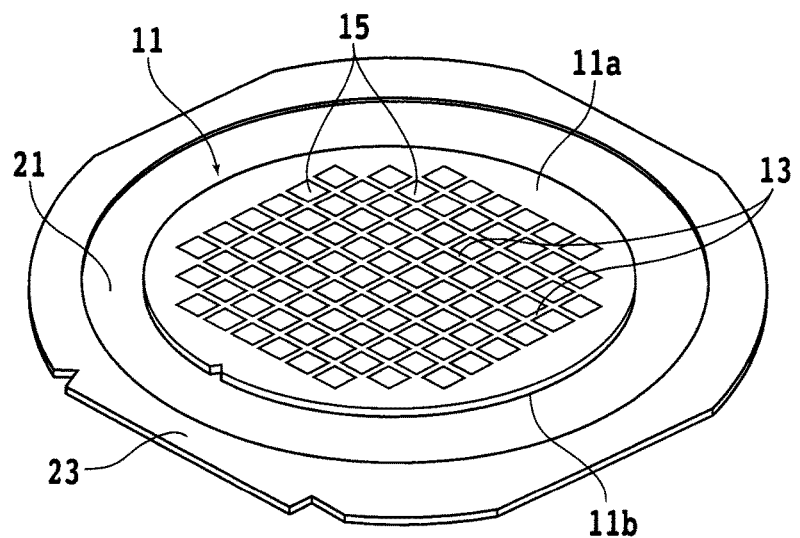
FIG. 4A is a schematic perspective view depicting the configuration of a wafer to be processed by a wafer processing method according to a preferred embodiment of the present invention.

A wafer processing method using the grinding apparatus 2 will now be described. FIG. 4A is a schematic perspective view depicting the configuration of the wafer 11 to be processed in this preferred embodiment. As depicted in FIG. 4A, the wafer 11 is a disk-shaped member formed of a semiconductor such as silicon. The wafer 11 has a front side 11a and a back side 11b. The front side 11a of the wafer 11 is composed of a central device area and a peripheral marginal area surrounding the device area. The device area is partitioned by a plurality of crossing division lines (streets) 13 to thereby define a plurality of separate regions where a plurality of devices 15 such as ICs and large scale integrations (LSI) are formed. Prior to processing the wafer 11, a dicing tape 21 is attached to the back side 11b of the wafer 11. An annular frame 23 is fixed to a peripheral portion of the dicing tape 21. Accordingly, the wafer 11 is supported through the dicing tape 21 to the annular frame 23 as depicted in FIG. 4A. While the wafer 11 is a disk-shaped member formed of a semiconductor such as silicon in this preferred embodiment, the material, shape, structure, etc. of the wafer 11 are not especially limited. For example, the wafer 11 may be formed of ceramics, resin, or metal. The kind, number, layout, etc. of the devices 15 are not especially limited. Further, the dicing tape 21 may not always be attached to the back side 11b of the wafer 11.

Figure 4B:
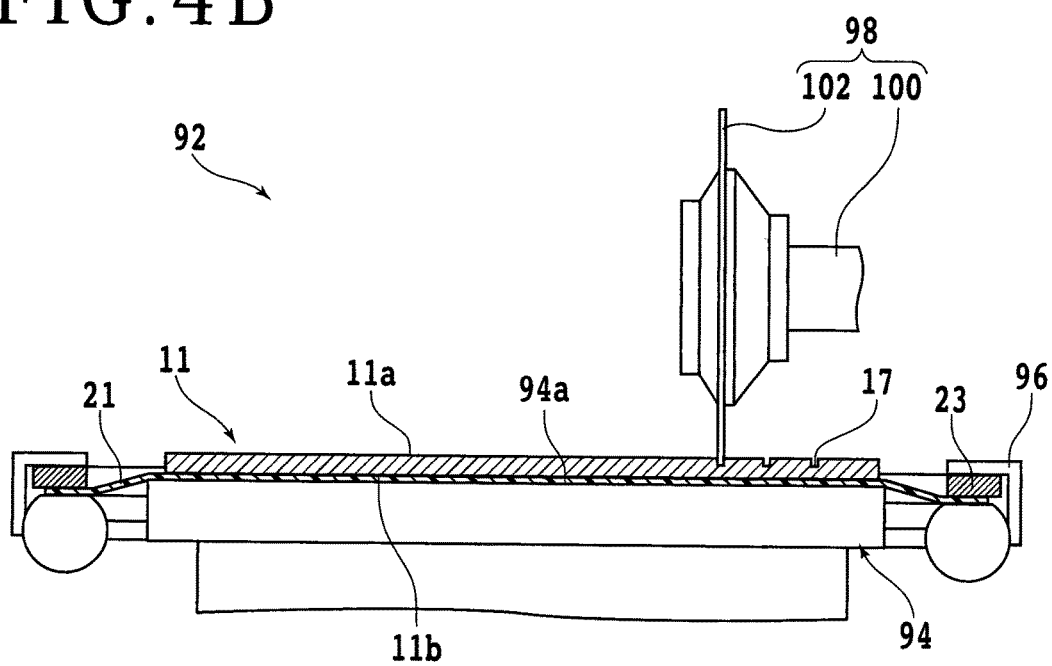
FIG. 4B is a partially sectional side view for illustrating a front processing step of the wafer processing method according to this preferred embodiment.

In the wafer processing method according to this preferred embodiment, a front processing step is first performed to form a groove on the front side 11a of the wafer 11. FIG. 4B is a partially sectional side view for illustrating the front processing step. In this preferred embodiment, the front processing step is performed by using a cutting apparatus 92 depicted in FIG. 4B. The cutting apparatus 92 includes a chuck table 94 for holding the wafer 11 under suction. The chuck table 94 is connected to a rotational drive source (not depicted) such as a motor and adapted to rotate about an axis substantially parallel to the vertical direction. A feeding mechanism (not depicted) is provided below the chuck table 94, so as to move the chuck table 94 in a feeding direction (perpendicular to the sheet plane of FIG. 4B). A part of the upper surface of the chuck table 94 is formed as a holding surface 94a for holding the back side 11b (the dicing tape 21) of the wafer 11. The holding surface 94a is connected through a passage (not depicted) to a vacuum source (not depicted), in which the passage is formed inside the chuck table 94. Accordingly, a vacuum produced by the vacuum source acts on the holding surface 94a to thereby hold the wafer 11 through the dicing tape 21 under suction. A plurality of clamps 96 for fixing the annular frame 23 are provided on the outer circumference of the chuck table 94.

A cutting unit 98 for cutting (grooving) the wafer 11 is provided above the chuck table 94 and the clamps 96. The cutting unit 98 includes a spindle 100 rotatable about an axis extending substantially perpendicular to the feeding direction as viewed in plan (i.e., in a horizontal plane). An annular cutting blade 102 is mounted on the spindle 100 at one end thereof. A rotational drive source (not depicted) such as a motor is connected to the other end of the spindle 100. Accordingly, the cutting blade 102 mounted on the spindle 100 at its one end is rotated by a force transmitted from this rotational drive source. The spindle 100 is supported by a moving mechanism (not depicted) in such a manner that the spindle 100 is movable in an indexing direction perpendicular to the feeding direction in the horizontal plane and also movable in a vertical direction (perpendicular to both the feeding direction and the indexing direction).

In the front processing step, the wafer 11 is placed on the chuck table 94 in the condition where the dicing tape 21 attached to the back side 11b of the wafer 11 (or the back side 11b in the case that the dicing tape 21 is not attached to the wafer 11) is in contact with the holding surface 94a of the chuck table 94. In this condition, a vacuum produced by the vacuum source is applied to the holding surface 94a to thereby hold the wafer 11 under suction. Furthermore, the clamps 96 are operated to fix the annular frame 23. In this manner, the wafer 11 is held by the chuck table 94 and the clamps 96 in the condition where the front side 11a of the wafer 11 is exposed upward. Thereafter, the chuck table 96 is rotated to make the direction of extension of a target one of the division lines 13 parallel to the feeding direction of the cutting apparatus 92. Further, the chuck table 96 and the cutting unit 98 are relatively moved to make the position of the cutting blade 102 lie on an extension line extending from the target division line 13 as viewed in plan. Thereafter, the cutting blade 102 is lowered to a depth corresponding to not less than a finished thickness of each chip 27 (the wafer 11). Further, the cutting blade 102 is rotated and the chuck table 94 is moved in the feeding direction parallel to the target division line 13. As a result, the front side 11a of the wafer 11 is cut along the target division line 13 by the cutting blade 102 being rotated, thereby forming a groove 17 along the target division line 13 on the front side 11a of the wafer 11, in which the groove 17 has the depth not less than the finished thickness of each chip 27. This step is repeated for the remaining division lines 13 to thereby form a plurality of similar grooves 17 along all the division lines 13 on the front side 11a of the wafer 11. Thus, the front processing step is finished.

Figure 5A:
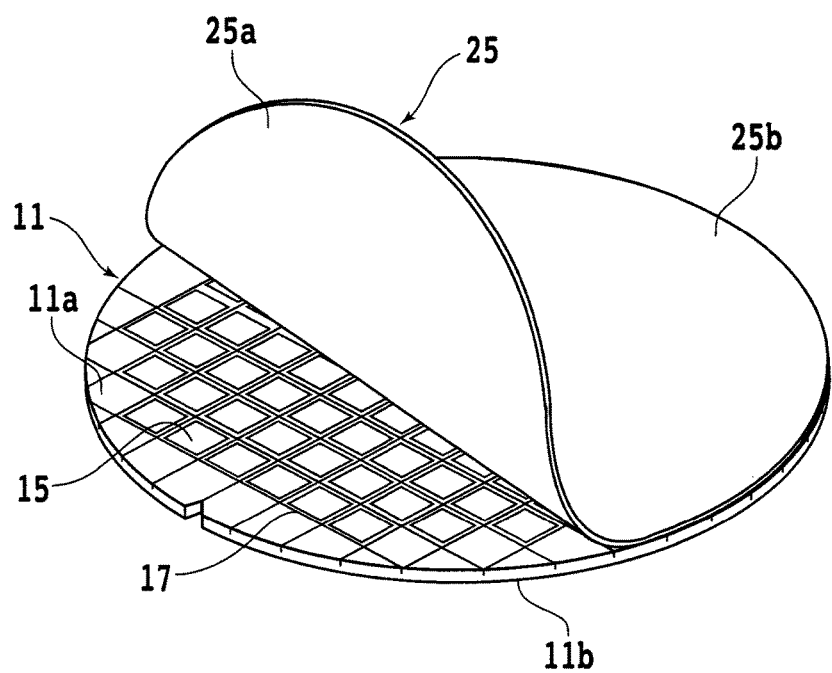
FIG. 5A is a perspective view for illustrating a protective member attaching step subsequent to the front processing step.

After performing the front processing step, a protective member attaching step is performed to attach a protective member 25 to the front side 11a of the wafer 11. FIG. 5A is a perspective view for illustrating the protective member attaching step. For example, the protective member 25 to be used in the protective member attaching step is a tape (film), resin substrate, or wafer, each having substantially the same shape and size as those of the wafer 11. Further, in the case that the protective member 25 is a wafer, the kind of this wafer may be the same as or different from the kind of the wafer 11. The protective member 25 has a first surface 25a and a second surface 25b. The first surface 25a of the protective member 25 is an adhesive surface formed as a paste layer of ultraviolet curing resin or the like. Accordingly, when the first surface 25a of the protective member 25 is brought into close contact with the front side 11a of the wafer 11, the protective member 25 can be attached to the wafer 11. As a result, it is possible to prevent damage to the devices 15 due to a load applied to the wafer 11 in grinding the wafer 11. In the case that the dicing tape 21 is attached to the back side 11b of the wafer 11, the dicing tape 21 is peeled to be removed from the wafer 11 before or after attaching the protective member 25.

Figure 5B:
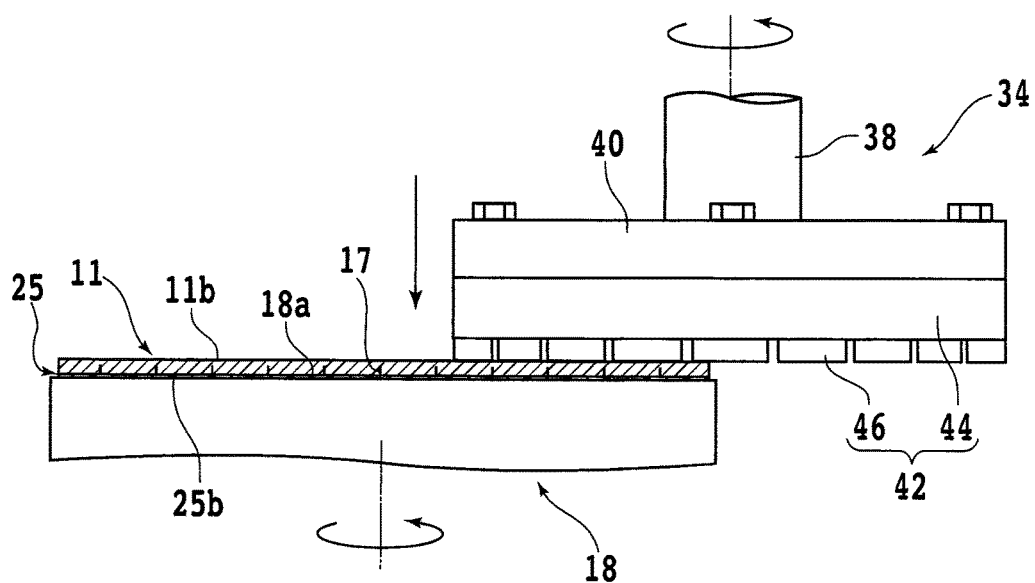
FIG. 5B is a side view for illustrating a grinding step subsequent to the protective member attaching step.

After performing the protective member attaching step, a grinding step is performed to grind the back side 11b of the wafer 11, thereby reducing the thickness of the wafer 11 to a predetermined thickness. FIG. 5B is a side view for illustrating the grinding step. The grinding step is performed by using the grinding apparatus 2 mentioned above. In the grinding step, the wafer 11 is placed on the chuck table 18 set at the standby position in the condition where the second surface 25b of the protective member 25 attached to the wafer 11 is in contact with the holding surface 18a of the chuck table 18. In this condition, a vacuum produced by the vacuum source is applied to the holding surface 18a. Accordingly, the wafer 11 is held through the protective member 25 on the chuck table 18 under suction in the condition where the back side 11b of the wafer 11 is exposed upward. Thus, in this grinding step, the back side 11b of the wafer 11 is an upper surface, and the front side 11a of the wafer 11 is a lower surface.

Thereafter, the turn table 16 depicted in FIG. 1 is rotated to move the chuck table 18 set at the standby position to the coarse grinding position. That is, the wafer 11 is moved to the position below the grinding wheel 42 for coarse grinding. Thereafter, as depicted in FIG. 5B, both the chuck table 18 and the grinding wheel 42 are rotated and the spindle housing 36 depicted in FIG. 1 is lowered. The lowering speed (lowering amount) of the spindle housing 36 is set so that the lower surface of each abrasive member 46 comes into pressure contact with the back side 11b of the wafer 11. As a result, the back side 11b of the wafer 11 can be ground coarsely to thereby thin the wafer 11. This coarse grinding is performed as measuring the thickness of the wafer 11 and is continued until the bottom of each groove 17 is exposed to the back side 11b of the wafer 11. As a result, the wafer 11 is divided along each groove 17 to obtain a plurality of chips 27. After finishing this coarse grinding, the turn table 16 is further rotated to move the chuck table 18 set at the coarse grinding position to the finish grinding position. That is, the wafer 11 is moved to the position below the grinding wheel 42 for finish grinding. Thereafter, the finish grinding is performed in a manner similar to that of the coarse grinding mentioned above. While the wafer 11 is subjected to two-stage grinding composed of the coarse grinding and the finish grinding in this preferred embodiment, the wafer 11 may be subjected to single-stage grinding or multi-stage grinding having three or more stages. Further, after performing the grinding step, a cleaning step may be performed to clean the wafer 11 by using the cleaning mechanism 50 depicted in FIG. 1.

Figure 6A:
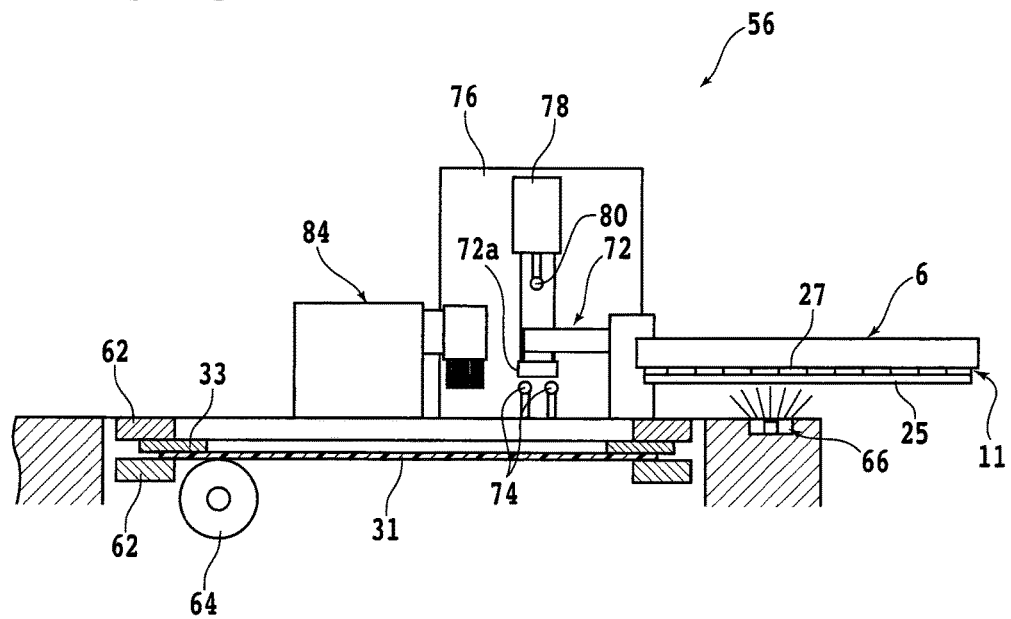
FIG. 6A is a partially sectional side view schematically depicting a manner of applying ultraviolet light to a protective member attached to the wafer in a determining step subsequent to the grinding step.

After performing the grinding step (or after performing the cleaning step in the case that the cleaning step is performed after performing the grinding step), a determining step is performed to measure the die strength of any one of the plural chips 27 obtained by dividing the wafer 11 and then determine whether or not grinding is to be performed to the remaining wafers 11 according to the result of this measurement. In this determining step, ultraviolet light is first applied from the ultraviolet light applying unit 66 to the protective member 25 attached to the wafer 11, thereby curing the paste layer of the protective member 25 to reduce the adhesive force of the protective member 25 to the wafer 11. FIG. 6A is a partially sectional side view schematically depicting a manner of applying ultraviolet light to the protective member 25. The ultraviolet light is applied to the protective member 25 in the following manner. As depicted in FIG. 6A, the back side 11b of the wafer 11 divided into the plural chips 27 is held under suction by the transfer mechanism 6, and the protective member 25 is exposed downward. In this condition, ultraviolet light is applied upward from the ultraviolet light applying unit 66 to the protective member 25, and the transfer mechanism 6 is moved to pass the wafer 11 above the ultraviolet light applying unit 66. Accordingly, the ultraviolet light can be applied to the whole of the protective member 25 to thereby cure the paste layer of the protective member 25.

Figure 6B:
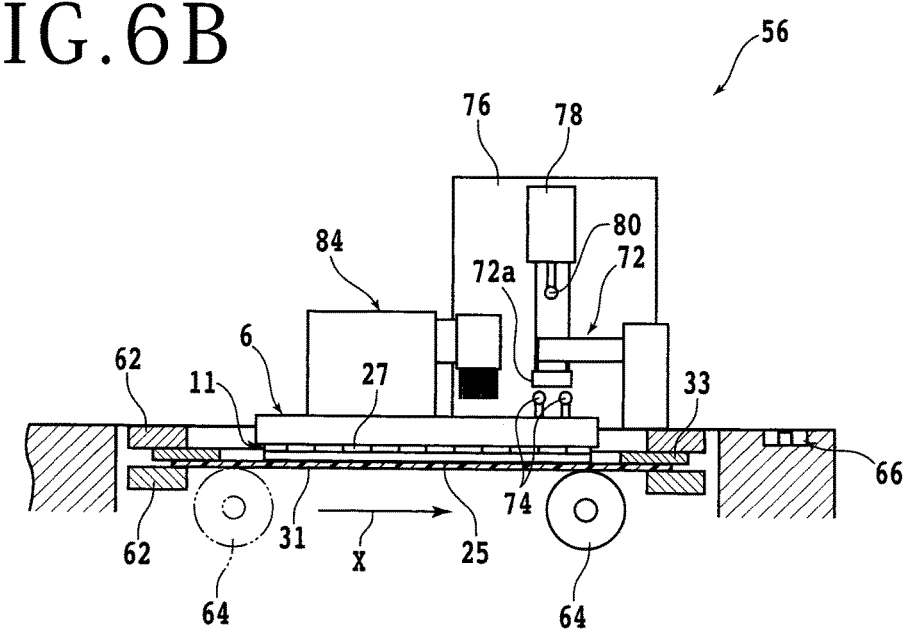
FIG. 6B is a partially sectional side view schematically depicting a manner of attaching the wafer to an adhesive tape in the determining step.

After applying the ultraviolet light to the protective member 25, the wafer 11 is attached to the adhesive tape 31 fixed to the frame 33 held by the frame clamp 62. FIG. 6B is a partially sectional side view schematically depicting a manner of attaching the wafer 11 to the adhesive tape 31. The wafer 11 is attached to the adhesive tape 31 in the following manner. As depicted in FIG. 6B, the transfer mechanism 6 holding the wafer 11 is first moved to bring the protective member 25 attached to the front side 11a of the wafer 11 into contact with the upper surface of the adhesive tape 31. Thereafter, the roller 64 is brought into contact with the lower surface of the adhesive tape 31 and then moved in the X direction as applying a pressure to the adhesive tape 31. Accordingly, the adhesive tape 31 can be attached to the protective member 25 attached to the front side 11a of the wafer 11. As a result, the wafer 11 is supported through the adhesive tape 31 and the frame 33 to the frame clamp 62.

Figure 7A:
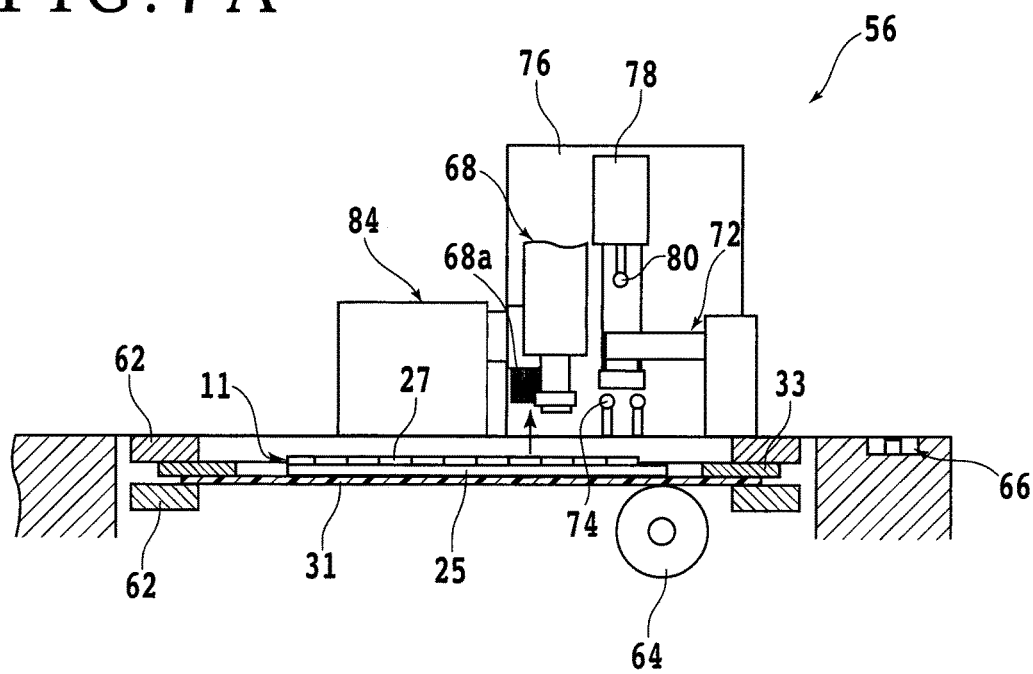
FIG. 7A is a partially sectional side view schematically depicting a manner of transferring a chip by using a first chip transfer unit in the determining step.
Figure 7B:
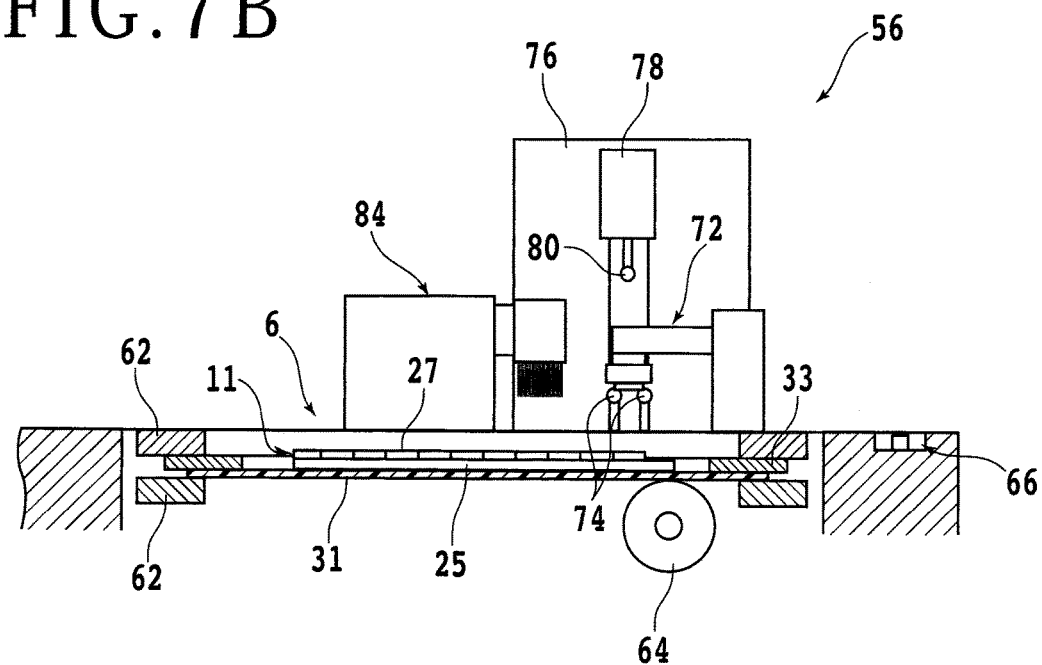
FIG. 7B is a partially sectional side view schematically depicting a manner of transferring the chip by using a second chip transfer unit in the determining step.

After attaching the wafer 11 to the adhesive tape 31, any one of the plural chips 27 obtained by dividing the wafer 11 is peeled from the protective member 25 and then transferred. FIG. 7A is a partially sectional side view schematically depicting a manner of transferring the chip 27 by using the first chip transfer unit 68, and FIG. 7B is a partially sectional side view schematically depicting a manner of transferring the chip 27 by using the second chip transfer unit 72. The chip 27 is transferred by the first and second chip transfer units 68 and 72 in the following manner. First, the adhesive tape 31 is expanded to thereby increase the spacing between any adjacent ones of the chips 27. More specifically, an annular member (not depicted) located below the adhesive tape 31 is raised at a position between the wafer 11 and the frame 33 to thereby push up the adhesive tape 31. As a result, the adhesive tape 31 can be expanded to increase the spacing between the adjacent chips 27. After increasing the spacing between the adjacent chips 27, the first chip transfer unit 68 is moved to bring the chip suction pad 68a into contact with the upper surface of any arbitrary one of the chips 27 supported by the frame clamp 62. Thereafter, a vacuum produced by the vacuum source is applied to the chip suction pad 68a to thereby hold this chip 27 under suction. Thereafter, the chip 27 held by the chip suction pad 68a is raised to be peeled from the protective member 25 as depicted in FIG. 7A. Thereafter, the first chip transfer unit 68 is moved to transfer the chip 27 to the temporary setting area 70 depicted in FIG. 2. Thereafter, the chip suction pad 72a of the second chip transfer unit 72 is brought into contact with the upper surface of the chip 27 set in the temporary setting area 70. Thereafter, a vacuum produced by the vacuum source is applied to the chip suction pad 72a to thereby hold the chip 27 under suction. Thereafter, the second chip transfer unit 72 is operated to mount the chip 27 on the pair of support members 74 as depicted in FIG. 7B.

Figure 8A:
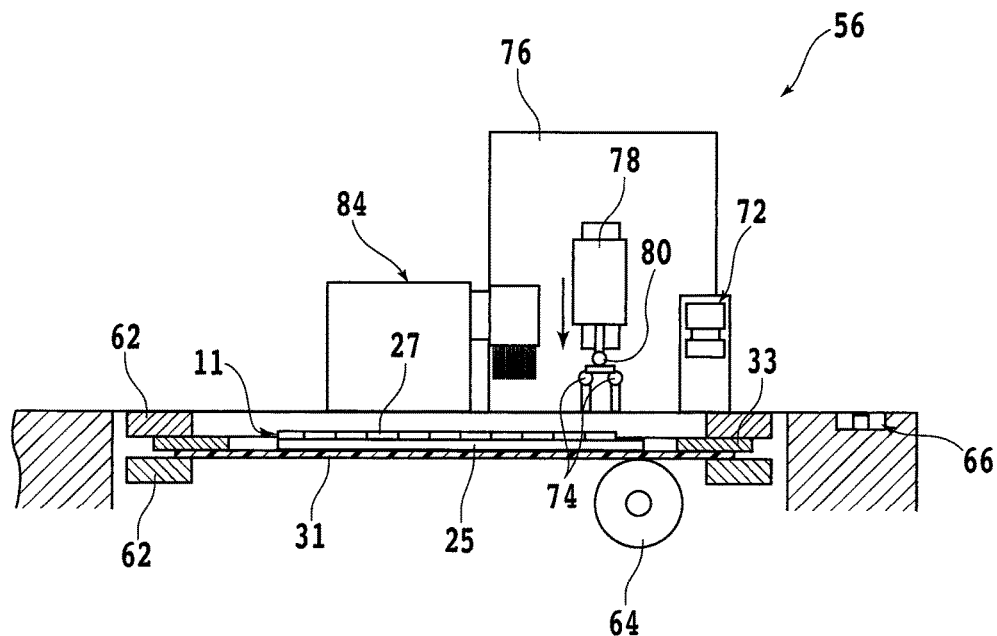
FIG. 8A is a partially sectional side view schematically depicting a manner of measuring the die strength of the chip in the determining step.

After transferring the chip 27 to the pair of support members 74, the die strength of the chip 27 is measured. FIG. 8A is a partially sectional side view schematically depicting a manner of measuring the die strength of the chip 27. The die strength of the chip 27 is measured in the following manner. First, the Z movable block 78 is lowered to apply a pressure to the chip 27 by using the pressure member 80. For example, a load on the chip 27 at break is transmitted as the result of measurement (measured value) to the control unit 58. The chip 27 broken is discarded into the discarding hole 82.

After measuring the die strength of the chip 27, the determining section 58a of the control unit 58 determines whether or not grinding is to be performed to the remaining wafers 11 stored in the cassette 8. More specifically, when the measured value is less than (or less than or equal to) the threshold value for the die strength, the determining section 58a determines that grinding is not to be performed to the remaining wafers 11 stored in the cassette 8. Conversely, when the measured value is greater than or equal to (or greater than) the threshold value for the die strength, the determining section 58a determines that grinding is to be performed to the remaining wafers 11 stored in the cassette 8.

Figure 8B:
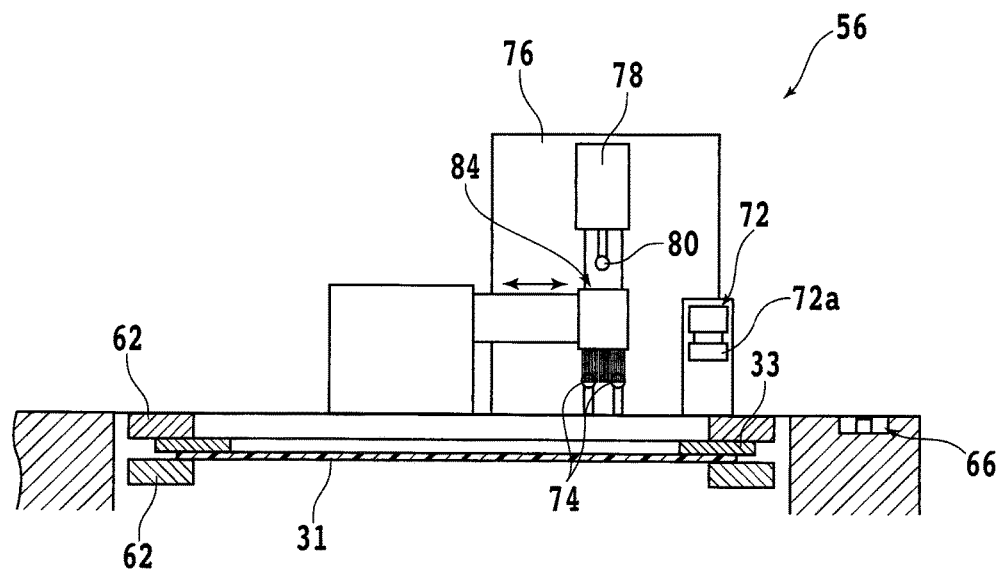
FIG. 8B is a partially sectional side view schematically depicting a manner of cleaning a pair of support members by using a cleaning unit.

While the measurement of the die strength is performed to any arbitrary selected one of the chips 27 in the above preferred embodiment, the measurement of the die strength may be performed to all of the chips 27 obtained by dividing the wafer 11. Further, after measuring the die strength, the pair of support members 74 is preferably cleaned by using the cleaning unit 84. FIG. 8B is a partially sectional side view schematically depicting a manner of cleaning the pair of support members 74 by using the cleaning unit 84.

As described above, the grinding apparatus 2 according to this preferred embodiment includes the die strength measuring unit 56 for measuring the die strength of any one of the chips 27 obtained by dividing the wafer 11 and the control unit 58 for controlling each component according to a measured value for the die strength measured by the die strength measuring unit 56, in which the control unit 58 has the determining section 58a for determining that grinding is not to be performed to the remaining wafers 11 stored in the cassette 8 when the measured value is less than a threshold value, whereas determining that grinding is to be performed to the remaining wafers 11 stored in the cassette 8 when the measured value is greater than or equal to the threshold value. Further, the wafer processing method using this grinding apparatus 2 includes the determining step of measuring the die strength of the chip 27 and determining that grinding is not to be performed to the remaining wafers 11 when the measured value for the die strength is less than the threshold value, whereas determining that grinding is to be performed to the remaining wafers 11 when the measured value is greater than or equal to the threshold value. Accordingly, by measuring the die strength of any one of the chips 27 obtained by dividing one of the wafers 11 stored in the cassette 8, i.e., rather than by grinding all of the wafers 11 stored in the cassette 8, it is possible to determine whether or not grinding is to be performed to the remaining wafers 11, according to the result of measurement of the die strength. Accordingly, it is possible to reduce the possibility that a large number of chips having low die strength may be manufactured. Furthermore, since the die strength of the chip 27 is measured in the grinding apparatus 2, time required for measurement of the die strength can also be reduced. Thus, the die strength of the chip 27 can be efficiently measured according to the grinding apparatus 2 and according to the wafer processing method using the grinding apparatus 2.

The present invention is not limited to the above preferred embodiment, but various modifications may be made. For example, while the front processing step in the above preferred embodiment is performed by using the cutting blade 102 to cut the front side 11a of the wafer 11 and thereby form the groove 17 along each division line 13, the groove 17 may be formed by any other methods. For example, a laser beam having an absorption wavelength to the wafer 11 may be used to perform ablation, thereby forming the groove 17 along each division line 13 on the front side 11a of the wafer 11.

Figure 9:
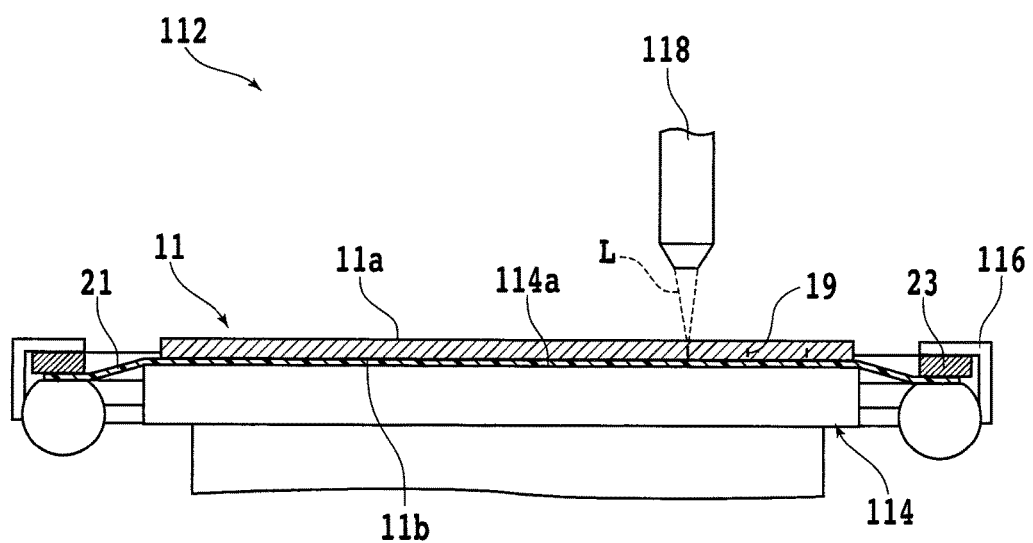
FIG. 9 is a partially sectional side view for illustrating a front processing step according to a modification.

Further, a laser beam having a transmission wavelength to the wafer 11 may be used to modify the inside of the wafer 11 near the front side 11a, thereby forming a modified layer as a division start point inside the wafer 11 along each division line 13. FIG. 9 is a partially sectional side view for illustrating a front processing step according to a modification of the above preferred embodiment. The front processing step according to this modification is performed by using a laser processing apparatus 112 depicted in FIG. 9. The laser processing apparatus 112 includes a chuck table 114 for holding the wafer 11 under suction. The chuck table 114 is connected to a rotational drive source (not depicted) such as a motor and adapted to rotate about an axis substantially parallel to the vertical direction. A moving mechanism (not depicted) is provided below the chuck table 114, so as to move the chuck table 114 in a feeding direction and an indexing direction perpendicular to the feeding direction in a horizontal plane. A part of the upper surface of the chuck table 114 is formed as a holding surface 114a for holding the back side 11b (the dicing tape 21) of the wafer 11. The holding surface 114a is connected through a passage (not depicted) to a vacuum source (not depicted), in which the passage is formed inside the chuck table 114. Accordingly, a vacuum produced by the vacuum source acts on the holding surface 114a to thereby hold the wafer 11 through the dicing tape 21 under suction. A plurality of clamps 116 for fixing the annular frame 23 are provided on the outer circumference of the chuck table 114. A laser beam applying unit 118 is provided above the chuck table 114. The laser beam applying unit 118 functions to apply a pulsed laser beam L oscillated by a laser oscillator (not depicted), in which the laser beam L is focused at a predetermined position. The laser oscillator is adapted to oscillate a pulsed laser beam L having a transmission wavelength to the wafer 11 (i.e., having a wavelength hard to absorb in the wafer 11).

In the front processing step according to this modification, the wafer 11 is placed on the chuck table 114 in the condition where the dicing tape 21 attached to the back side 11b of the wafer 11 (or the back side 11b in the case that the dicing tape 21 is not attached to the wafer 11) is in contact with the holding surface 114a of the chuck table 114. In this condition, a vacuum produced by the vacuum source is applied to the holding surface 114a to thereby hold the wafer 11 under suction. Furthermore, the clamps 116 are operated to fix the annular frame 23. In this manner, the wafer 11 is held by the chuck table 114 and the clamps 116 in the condition where the front side 11a of the wafer 11 is exposed upward. Thereafter, the chuck table 114 is rotated to make the direction of extension of a target one of the division lines 13 parallel to the feeding direction of the laser processing apparatus 112. Further, the chuck table 114 is moved to make the position of the laser beam applying unit 118 lie on an extension line extending from the target division line 13 as viewed in plan. Thereafter, as depicted in FIG. 9, the laser beam L is applied from the laser beam applying unit 118 to the front side 11a of the wafer 11, and at the same time the chuck table 114 is moved in the feeding direction parallel to the target division line 13.

The laser beam L is focused inside the wafer 11 near the front side 11a. In this manner, the laser beam L having a transmission wavelength to the wafer 11 is focused inside the wafer 11 near the front side 11a, thereby modifying the inside of the wafer 11 near the front side 11a to form a modified layer 19 as a division start point inside the wafer 11 near the front side 11a along the target division line 13. Preferably, the modified layer 19 is formed at a depth corresponding to a region to be removed by the grinding step performed thereafter. This front processing step is repeated for the remaining division lines 13 to thereby form a plurality of similar modified layers 19 along all the division lines 13 inside the wafer 11 near the front side 11a. Thus, the front processing step is finished. As another modification, a plurality of modified layers 19 may be formed at different depths along each division line 13. Further, while the laser beam L is applied to the front side 11a of the wafer 11 in this modification, the laser beam L may be applied to the back side 11b of the wafer 11. In this case, the dicing tape 21 is attached to the front side 11a of the wafer 11.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A grinding apparatus comprising:
    a chuck table for holding the front side of a wafer having a modified layer near the front side or a groove on the front side, said groove having a depth not less than a finished thickness of said wafer;
    a grinding unit for grinding the back side of said wafer held on said chuck table to thereby divide said wafer into a plurality of chips along said modified layer or said groove;
    a cassette mounting area for mounting a cassette storing a plurality of wafers including said wafer;
    a loading unit for loading said wafer from said cassette mounted on said cassette mounting area to said chuck table;
    a die strength measuring unit for measuring the die strength of any one of said chips obtained by dividing said wafer in said grinding unit; and
    a control unit for controlling each component according to a measured value for the die strength measured by said die strength measuring unit;
    said control unit having a determining section for determining that grinding is not to be performed to the remaining wafers stored in said cassette when said measured value is less than a threshold value, whereas determining that grinding is to be performed to the remaining wafers stored in said cassette when said measured value is greater than or equal to said threshold value.

2. The grinding apparatus according to claim 1,
    wherein a protective member is attached to the front side of said wafer, and the front side of said wafer is held through said protective member on said chuck table, and
    said grinding apparatus further includes a chip transfer unit for peeling said chip from said protective member and transferring said chip to said die strength measuring unit.

3. A wafer processing method using a grinding apparatus including a chuck table for holding the front side of a wafer having a modified layer near the front side or a groove on the front side, said groove having a depth not less than a finished thickness of said wafer, a grinding unit for grinding the back side of said wafer held on said chuck table to thereby divide said wafer into a plurality of chips along said modified layer or said groove, a cassette mounting area for mounting a cassette storing a plurality of wafers including said wafer, a loading unit for loading said wafer from said cassette mounted on said cassette mounting area to said chuck table, a die strength measuring unit for measuring the die strength of any one of said chips obtained by dividing said wafer in said grinding unit, and a control unit for controlling each component according to a measured value for the die strength measured by said die strength measuring unit, said control unit having a determining section for determining that grinding is not to be performed to the remaining wafers stored in said cassette when said measured value is less than a threshold value, whereas determining that grinding is to be performed to the remaining wafers stored in said cassette when said measured value is greater than or equal to said threshold value, said wafer processing method comprising:
    a front processing step of forming said modified layer near the front side of said wafer or said groove on the front side of said wafer;
    a protective member attaching step of attaching a protective member to the front side of said wafer after performing said front processing step;
    a grinding step of grinding by said grinding unit the back side of said wafer held through said protective member on said chuck table after performing said protective member attaching step, thereby dividing said wafer into said chips along said modified layer or said groove; and a determining step of measuring the die strength of any one of said chips obtained by dividing said wafer after performing said grinding step, and then determining that grinding is not to be performed to the remaining wafers stored in said cassette when said measured value is less than said threshold value, whereas determining that grinding is to be performed to the remaining wafers stored in said cassette when said measured value is greater than or equal to said threshold value.

* * * * *